US009871343B2

(12) United States Patent
Menezo

(10) Patent No.: US 9,871,343 B2
(45) Date of Patent: Jan. 16, 2018

(54) PHOTONIC TRANSMITTER WITH WAVEGUIDE FORMED OF PARTICULAR OPPOSING ELECTRODES

(71) Applicant: Commissariat A L'Energie Atomique et aux Energies Alternatives, Paris (FR)

(72) Inventor: Sylvie Menezo, Voiron (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/425,291

(22) Filed: Feb. 6, 2017

(65) Prior Publication Data

US 2017/0237229 A1    Aug. 17, 2017

(30) Foreign Application Priority Data

Feb. 12, 2016  (FR) ...................... 16 51138

(51) Int. Cl.
*H01S 5/026* (2006.01)
*G02F 1/025* (2006.01)
(Continued)

(52) U.S. Cl.
CPC ............ *H01S 5/0265* (2013.01); *G02F 1/025* (2013.01); *H01S 5/0218* (2013.01);
(Continued)

(58) Field of Classification Search
CPC .... H01S 5/0265; H01S 5/0218; H01S 5/3013; H01S 5/02; H01S 5/026; H01S 5/30;
(Continued)

(56) References Cited

U.S. PATENT DOCUMENTS 6,256,426 B1    7/2001  Duchet
6,845,198 B2    1/2005  Montgomery et al.
(Continued)

FOREIGN PATENT DOCUMENTS

FR          2 786 887 A1     6/2000
WO     WO 2011/037686 A1    3/2011

OTHER PUBLICATIONS

French Preliminary Search Report dated Oct. 10, 2016 in French Application 16 51138, filed on Feb. 12, 2016 (with English Translation of Categories of Cited Documents and Written Opinion).
(Continued)

*Primary Examiner* — Andrew Jordan
(74) *Attorney, Agent, or Firm* — Oblon, McClelland, Maier & Neustadt, L.L.P.

(57) ABSTRACT

This photonic transmitter includes a layer made of dielectric material, a sublayer made of doped III-V crystalline material extending directly over the layer made of dielectric material, a laser source including the sublayer made of doped III-V crystalline material, a modulator including a waveguide formed by proximal ends facing first and second electrodes and that segment of the layer made of dielectric material which is interposed between these proximal ends, and a zone composed only of one or more solid dielectric materials, which extends from a distal end of the second electrode to a substrate, and under the entirety of the distal end of the second electrode.

14 Claims, 4 Drawing Sheets

(51) Int. Cl.
*H01S 5/30* (2006.01)
*H01S 5/02* (2006.01)

(52) U.S. Cl.
CPC ........ *H01S 5/3013* (2013.01); *G02F 2201/06* (2013.01); *G02F 2201/12* (2013.01); *G02F 2202/105* (2013.01)

(58) Field of Classification Search
CPC .. G02F 1/025; G02F 2201/06; G02F 2201/12; G02F 2202/105
See application file for complete search history.

(56) References Cited

U.S. PATENT DOCUMENTS

| | | | |
|---|---|---|---|
| 8,937,296 B2* | 1/2015 | Bowers | H01L 31/1852 257/14 |
| 9,097,848 B2* | 8/2015 | Bowers | H01L 31/1852 |
| 2004/0240024 A1 | 12/2004 | Mohseni | |
| 2009/0106850 A1 | 4/2009 | Shastri et al. | |
| 2014/0376857 A1* | 12/2014 | Chantre | G02B 6/12002 385/14 |
| 2015/0055910 A1 | 2/2015 | Liang | |
| 2015/0055911 A1* | 2/2015 | Bowers | H01L 31/1852 385/2 |
| 2015/0277159 A1 | 10/2015 | Fujikata et al. | |
| 2015/0380900 A1 | 12/2015 | Liang | |
| 2017/0237229 A1* | 8/2017 | Menezo | G06F 1/025 |

OTHER PUBLICATIONS

Martijn J.R.Heck et al. "Hybrid Silicon Photonic Integrated Circuit Technology", IEEE Journal of Selected Topics in Quantum Electronics, vol. 19, No. 4, 2013, 17 pages.

M.N. Sysak et al. "Thermal management in hybrid silicon lasers", OFC/NFOEC Technical Digest, 2013, 3 pages.

D. Fitsios et al. "High-gain 1.3μm GaInNAs semiconductor optical amplifier with enhanced temperature stability for all-optical signal processing at 10Gb/s", Applied Optics, vol. 54, No. 1, 2015, 8 pages.

B. Ben Bakir et al. "Hybrid Si/III-V lasers with adiabatic coupling", Group IV Photonics (GFP), 2011 8th IEEE International Conference on Group IV Photonics, 2011, 3 pages.

Amnon Yariv et al. "Supermode Si/III-V hybrid lasers, optical amplifiers and modulators: A proposal and analysis", Optics Express, vol. 15, No. 15, 2007, 5 pages.

* cited by examiner

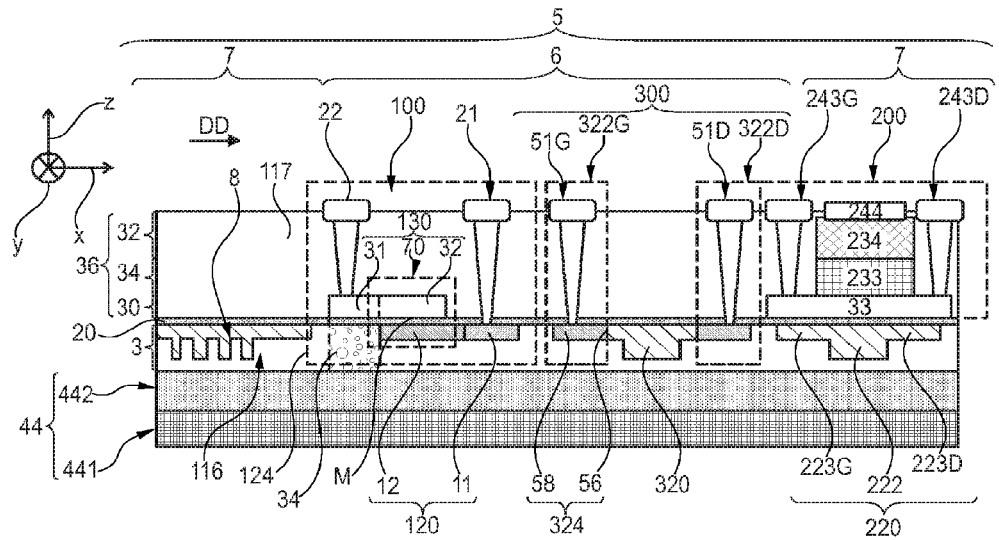
Fig. 1
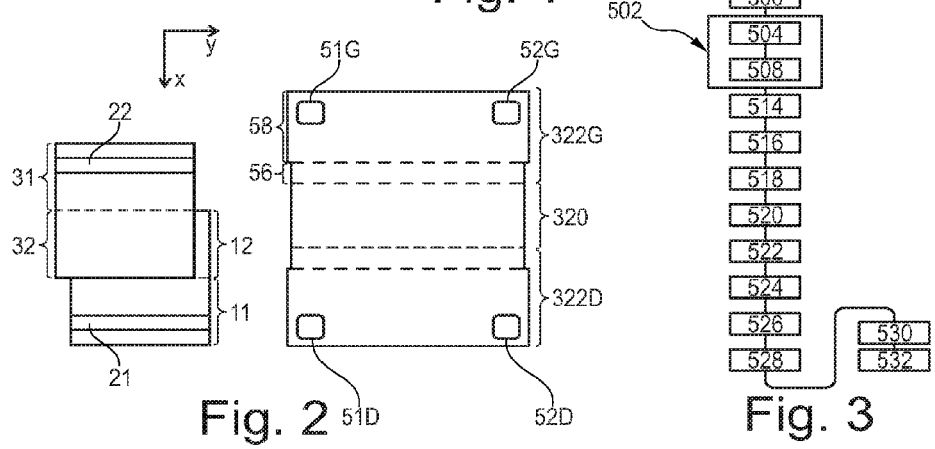
Fig. 2
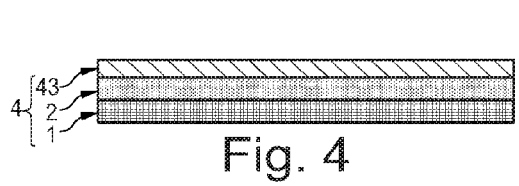
Fig. 3
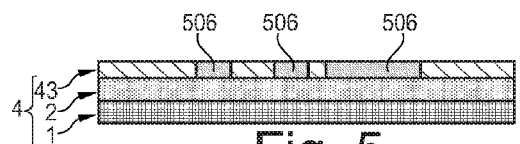
Fig. 4
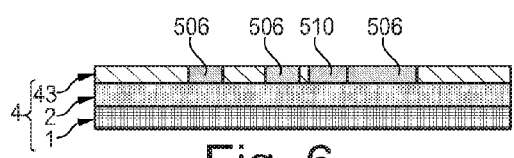
Fig. 5
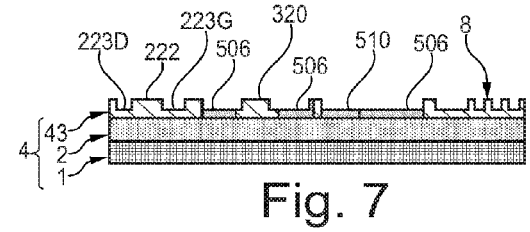
Fig. 6
Fig. 7

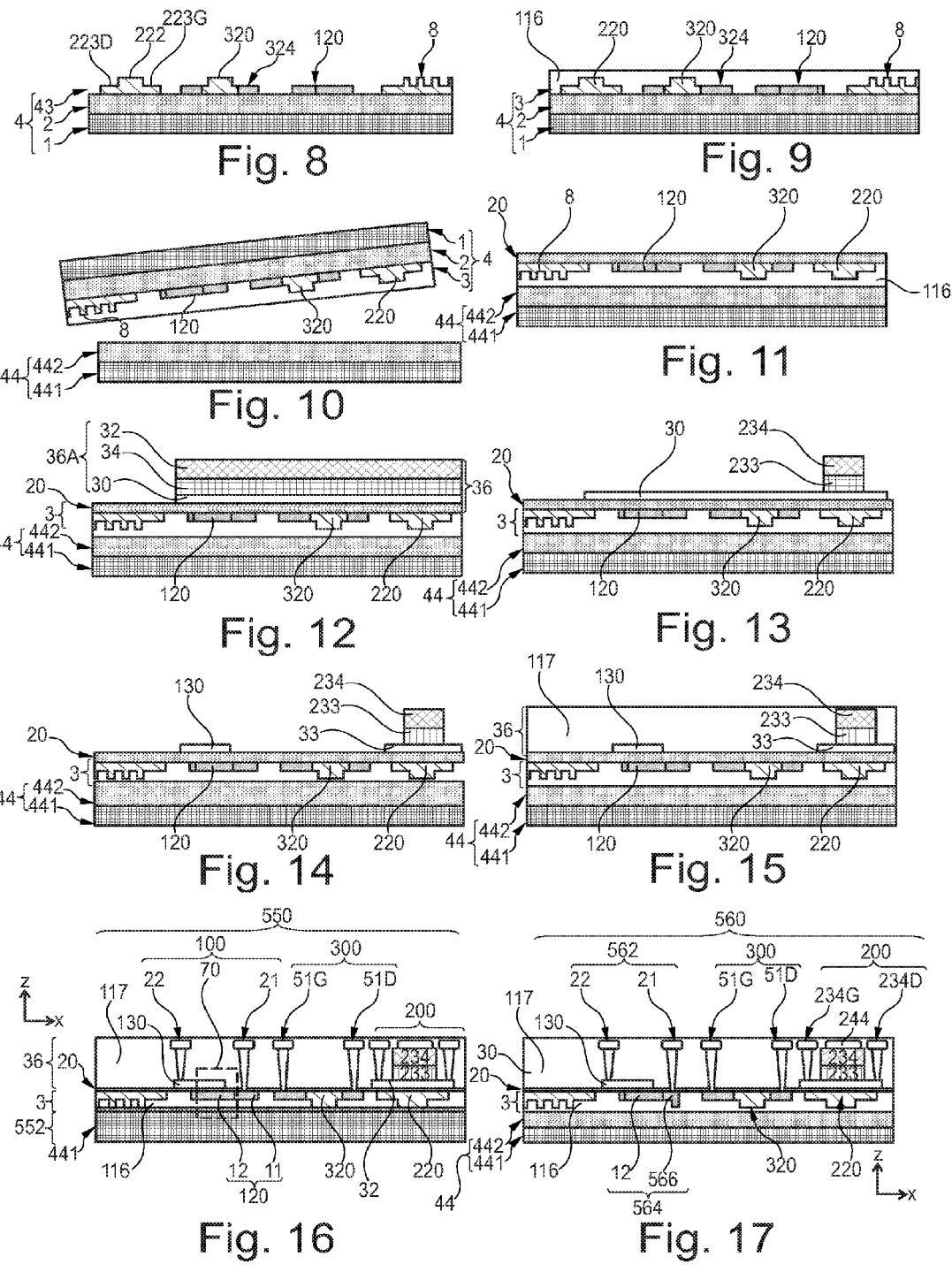

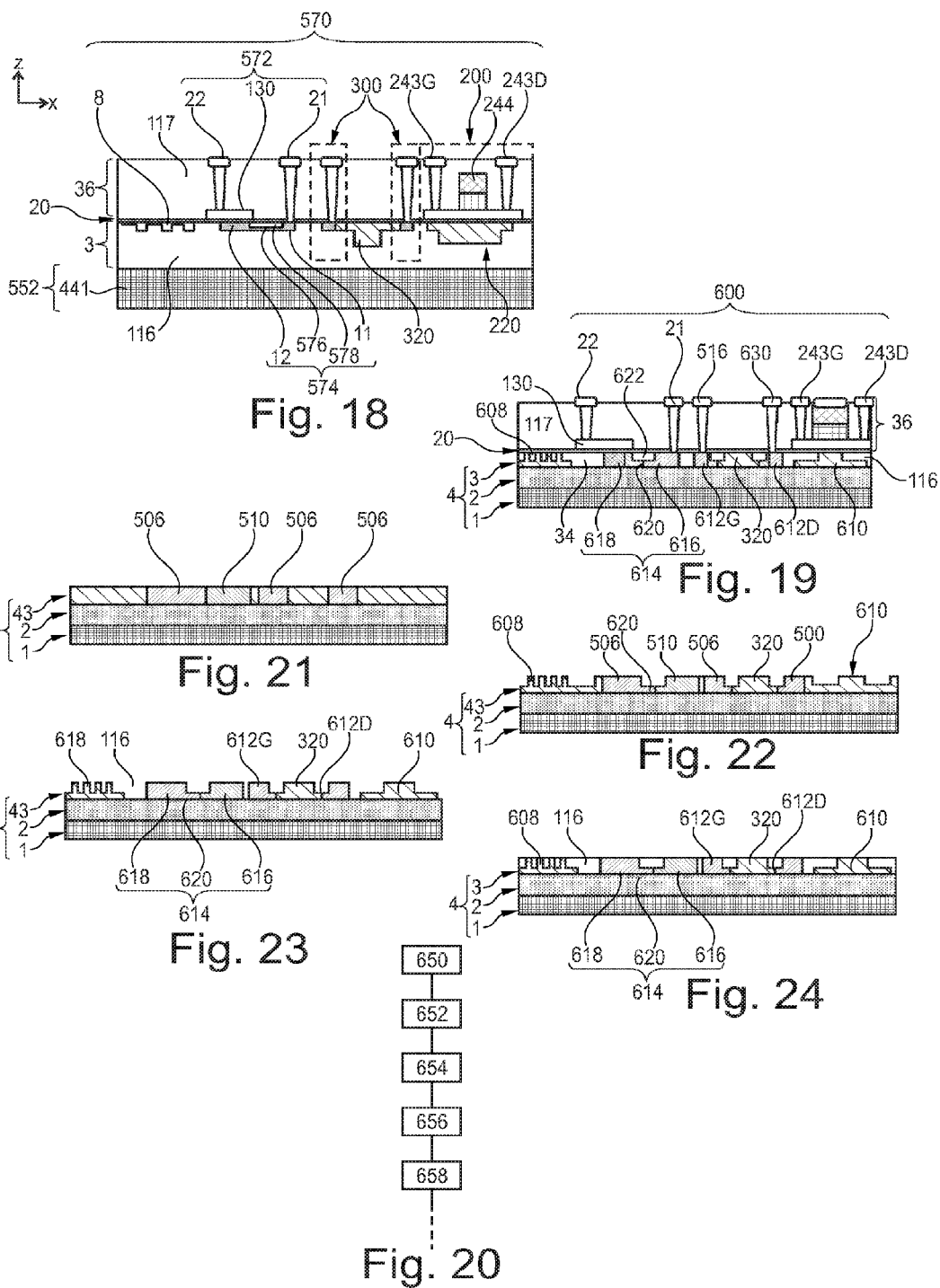

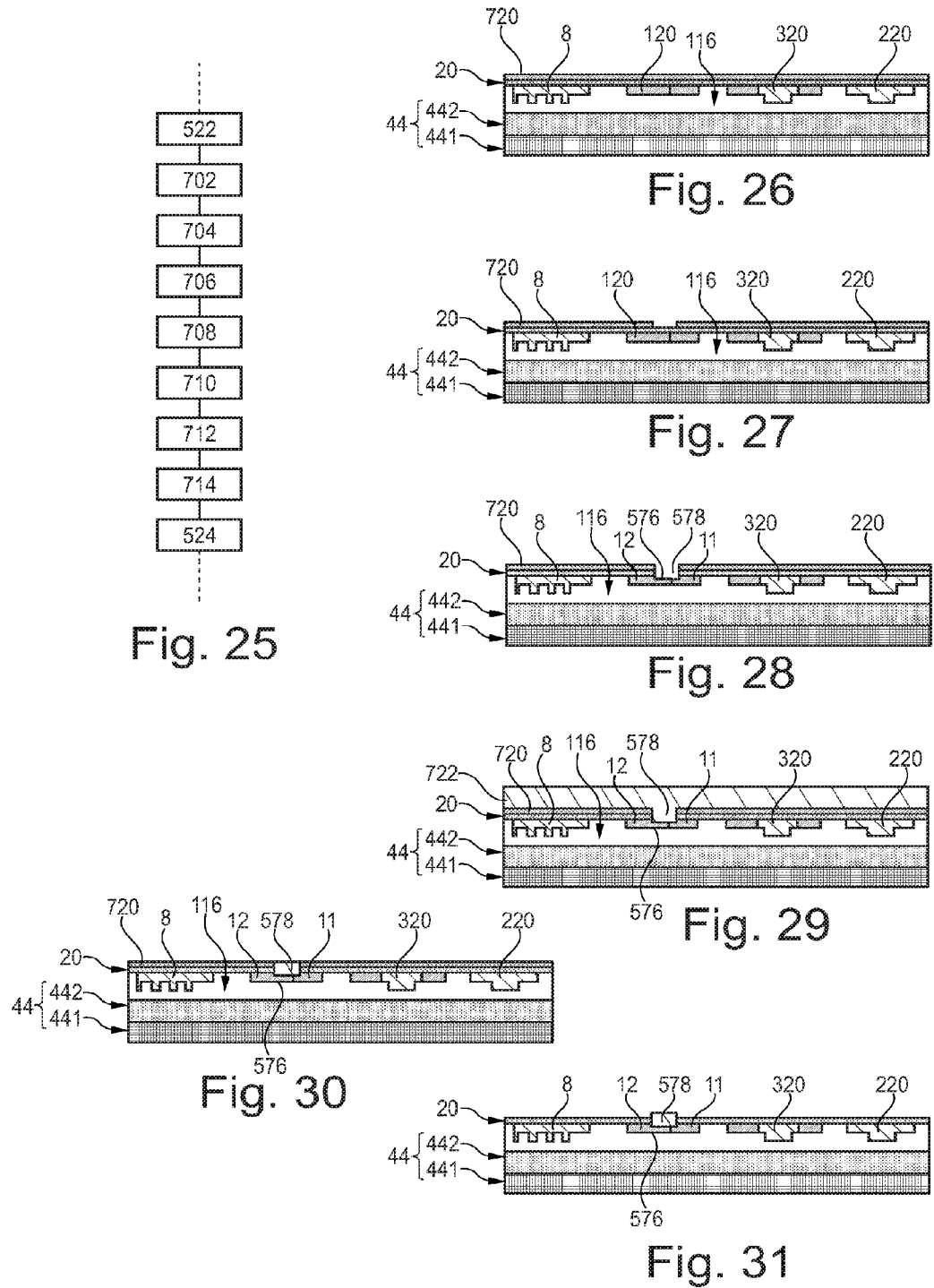

PHOTONIC TRANSMITTER WITH WAVEGUIDE FORMED OF PARTICULAR OPPOSING ELECTRODES

The invention relates to a photonic transmitter including a laser source and a modulator. Another subject of the invention is a process for fabricating this transmitter.

By propagation loss, what is meant is the optical losses seen by the optical mode propagating in a waveguide in which it is guided.

By propagation index, what is meant is the effective propagation index of the optical mode propagating in a waveguide in which it is guided.

Known photonic transmitters include:
- a stack including a substrate mainly extending in a plane called the "plane of the substrate" and a layer, including single-crystal silicon, extending directly over this substrate and mainly parallelly to the plane of the substrate,
- a semiconductor laser source able to generate an optical signal, this laser source including a first waveguide made of III-V material etched in a layer made of III-V gain material, this layer made of III-V gain material including a sublayer made of doped III-V crystalline material,
- a modulator of the propagation losses and of the propagation index of a guided optical signal produced in the same substrate and able to modulate the optical signal generated by the semiconductor laser source, this modulator including:
  - a first electrode made of p- or n-doped single-crystal silicon structured in the single-crystal silicon of the layer including single-crystal silicon,
  - a second electrode made of doped III-V crystalline material having a doping of opposite type to that of the first electrode.

Such a transmitter is for example disclosed in patent application US2015/380900A1.

Moreover, known modulators include a waveguide formed by stacking immediately on top of one another:
- a proximal end of a first electrode made of single-crystal silicon,
- a thin layer made of dielectric material, and
- a proximal end of a second electrode.

For example, such a modulator is described in patent application US 2009103850.

By applying a potential difference between the first and second electrodes, the charge carrier density at the level of the interfaces between the layer made of dielectric material and the proximal ends of the first and second electrodes is modified. This induces a modification of the propagation losses and propagation index seen by the guided optical field propagating in the waveguide. Typically, the layer made of dielectric material is a layer made of silicon dioxide. It is very difficult to epitaxially grow a layer of single-crystal silicon on such a layer made of silicon dioxide. Thus, it has been proposed to produce the second electrode from polycrystalline or amorphous silicon. However, the use of an electrode made of polycrystalline or amorphous silicon increases the optical losses of the field, this being undesirable.

To remedy this drawback, patent application WO2011/037686 proposes a fabricating process that allows the second electrode of the modulator to be produced from single-crystal silicon, by bonding of a layer made of single-crystal silicon.

Patent application US 2015/0055910 for its part proposes producing the second electrode from a III-V crystalline material such as InP by direct bonding to the silicon of a layer made of III-V crystalline material. The use of a III-V crystalline material to produce the second electrode necessarily limits optical losses with respect to the case where it is produced from polycrystalline or amorphous silicon.

More precisely, the modulator described with reference to FIG. 2 of patent application US 2015/0055910 comprises:
- a substrate mainly extending in a plane called the "plane of the substrate" and a layer, including single-crystal silicon, extending directly over this substrate and mainly parallelly to the plane of the substrate,
- a first electrode made of n- or p-doped single-crystal silicon, which electrode is structured in the single-crystal silicon of the layer including single-crystal silicon, this first electrode extending, in a transverse direction parallel to the plane of the substrate, from a proximal end to a distal end, and extending longitudinally in the direction of propagation of the optical signal,
- a second electrode made of doped III-V crystalline material having a doping of opposite type to that of the first electrode, this second electrode extending, in the transverse direction, from a proximal end located facing the proximal end of the first electrode to a distal end located on a side that is opposite the distal end of the first electrode with respect to an axis perpendicular to the plane of the substrate and passing through the proximal ends, this second electrode also extending longitudinally in the direction of propagation of the optical signal,
- a layer made of dielectric material, which layer is interposed between the proximal ends of the first and second electrodes in order to electrically insulate them from each other,
- a first waveguide able to guide the optical signal to be modulated in the direction of propagation of the optical signal, this first waveguide being formed by the proximal ends of the electrodes and that segment of the layer made of dielectric material which is interposed between these proximal ends,
- contacts making direct mechanical and electrical contact with, respectively, the distal ends of the electrodes, for electrically connecting the first and second electrodes to different electric potentials so as to modify the charge carrier density inside the first waveguide,
- a zone that extends:
  - in the direction perpendicular to the plane of the substrate, from the distal end of the second electrode to the substrate, and
  - in the transverse direction and in the direction of propagation of the optical signal, under the entirety of the distal end of the second electrode.

In patent application US2015/0055910, the zone that extends under the distal end of the second electrode to the substrate on which the single-crystal silicon layer is deposited includes a block (referenced 116 in FIG. 2 of patent application US2015/0055910) made of single-crystal silicon that is insulated from the waveguide by a block of air (referenced 112 in FIG. 2 of patent application US2015/0055910).

By construction, in the modulator of patent application US2015/0055910 or WO2011/037686 or US2009103850, the thickness of single-crystal silicon constituting the proximal end of the first electrode of the modulator must be equal to the total thickness of the single-crystal silicon deposited on the substrate.

Prior art is also known from: U.S. Pat. No. 6,845,198B2, US2015/277159A1, US2015/380900A1 and from the following article:

Martijn J R Heck et al: "Hybrid Silicon Photonic Integrated Circuit Technology" IEEE Journal of selected topics in quantum electronics, IEEE Service Center, NJ, US, Vol. 19, No. 4, Jan. 7, 2013, page 6100117.

The invention described here aims to provide a transmitter the performance of which is improved while remaining simple to fabricate.

Its subject is therefore such a transmitter in accordance with claim 1.

In the claimed transmitter, the modulator preserves the advantage of low losses of the modulator of patent application US2015/0055910. This is because one of the electrodes is made of a single-crystal silicon whereas the other electrode is made of III-V crystalline material.

In addition, the claimed modulator has, with respect to the modulator of patent application US2015/0055910, no parasitic capacitance, thereby allowing a modulation speed to be obtained that is much more rapid than that of the modulator of patent application US2015/0055910. More precisely, it has been discovered that the distal end of the second electrode (referenced 104 in FIG. 2 of US2015/0055910) of the modulator of patent application US2015/0055910 forms, with the layer made of dielectric material (referenced 118 in FIG. 2 of patent application US2015/0055910) and a block (referenced 116 in FIG. 2 of patent application US2015/0055910) of the layer made of single-crystal silicon, a parasitic capacitance that greatly decreases the modulation speed of the modulator of patent application US2015/0055910. In contrast, in the claimed modulator, the zone located under the distal end of the second electrode is formed only from a dielectric material and thus the capacitance of the parasitic capacitor in this location is greatly decreased.

Generally, the fact that the first electrode is encapsulated in the dielectric material also facilitates the fabrication of this modulator. For example, the margins of error in the alignment of the electrodes facing each other may be quite large because this alignment error does not create a large parasitic capacitance in the case of the claimed modulator.

Embodiments of this transmitter may include one or more of the features of the dependent claims.

These embodiments of the transmitter furthermore have the following advantages:

The fact that the second electrode is produced in the same sublayer made of III-V crystalline material as that used to produce the waveguide made of III-V material of the laser source greatly simplifies the fabrication of the transmitter.

The fact that the thickness of the proximal end of the first electrode is different from the thickness of the waveguide made of single-crystal silicon located under the waveguide made of III-V material of the laser source allows both the operation of the laser source and the operation of the modulator to be improved. Specifically, to improve the operation of the laser source, it is desirable for the thickness of the waveguide located under the waveguide made of III-V material of this laser source to be large. In contrast, to improve the operation of the modulator, it is desirable for the thickness of the proximal end of the first electrode to be about equal to the thickness of the proximal end of the second electrode. However, the thickness of the proximal end of the second electrode is generally smaller than the thickness of the waveguide located under the waveguide made of III-V material.

The fact that the maximum thickness of the proximal end of the first electrode is strictly smaller than the maximum thickness of the second waveguide makes it possible to bring closer, to the layer made of dielectric material, the point at which the maximum of the intensity of the optical field that propagates in the waveguide is located. In so doing, this point is brought closer to the zone in which the charge carrier density is maximum when a potential difference is applied between the contacts of this modulator. This improves the effectiveness of this modulator.

Similarly, choosing the maximum thickness of the proximal end of the first electrode so that it is close to the maximum thickness of the proximal end of the second electrode, improves the effectiveness of the modulator, in particular if the materials have about the same refractive indices, this for example being the case for InP and silicon or GaAs and silicon. For example, refractive indices $n_1$ and $n_2$ are considered to be about the same if the index $n_1$ is comprised in the interval $[0.7n_2; 1.3n_2]$ and, preferably, in the interval $[0.85n_2; 1.15n_2]$ or $[0.95n_2; 1.05n_2]$.

The presence of a thinned intermediate portion in the electrode limits the consequences of alignment errors during the fabrication of the transmitter and therefore allows a modulator in which parasitic capacitances are decreased to be obtained.

The use of a phase tuning device including an arm made of silicon a distal end of which forms an electrical resistor formed from doped silicon and the proximal end of which makes direct mechanical contact with a waveguide made of silicon allows this waveguide to be effectively heated while limiting propagation losses in this waveguide. Specifically, in this tuning device, the electrical resistor is remote from the waveguide and therefore does not increase propagation losses in this waveguide. Thus, this tuning device is advantageous with respect to known tuning devices including an electrical resistor obtained by doping a region of the waveguide or by producing an electrical resistor in immediate proximity to the waveguide. Specifically in the latter two cases, the electrical resistor is located inside a zone in which the intensity of the optical field of the propagating optical signal is high, thereby inducing substantial propagation losses.

Another subject of the invention is a process for fabricating the claimed transmitter.

In the claimed fabricating process, the thickness of the single-crystal silicon may be adjusted as desired and, in particular, depending on the thickness of the second electrode. Thus, it is possible to place the intensity maximum of the guided optical field at the level of the interface of the layer made of dielectric material i.e. where the charge carrier density variation is maximum. This is not possible with the processes for fabricating the modulators of patent applications US2015/0055910, WO2011/037686 and US2009103850. Specifically, in these patent applications, the thickness of single-crystal silicon constituting the proximal end of the first electrode must be equal to the maximum thickness of the layer made of single-crystal silicon. It cannot be decreased only at the level of the proximal end of the first electrode. However, in the case of a transmitter including a waveguide produced in this layer made of silicon, it is the maximum thickness of this waveguide that sets the thickness of the layer made of silicon. The thickness of the proximal end of the first electrode cannot therefore be freely adjusted in the known processes for fabricating a transmitter. In addition, the claimed process also allows the error in the width of the proximal end of the first electrode of the modulator to be limited. Specifically, in patent application US2015/0055910, the left side of the proximal end of the electrode made of silicon is produced in a first etching step then the right side of this proximal end is produced in a second etching step. If in each etching step the alignment error is +/−100 nm, the error in the width W of this proximal end in the modulator of US2015/0055910 is then +/−200 nm. In contrast, the claimed process allows the right and left sides of the proximal end of the first electrode to be etched simultaneously. Therefore, the error in the width W of the proximal end of the first electrode is only +/−100 nm with the claimed process.

Embodiments of the fabricating process furthermore have the following advantages:

Using a buried layer made of dielectric material the thickness of which is smaller than 100 nm or 70 nm allows the amount of material to be removed to obtain the thickness desired for this layer to be limited. By virtue of this, the obtained layer of desired thickness is more planar, thereby improving the performance of the modulator and the performance of the laser source.

Fabricating at the same time the second electrode of the modulator and some parts of the laser source simplifies the fabrication of the transmitter.

The invention will be better understood on reading the following description, which is given merely by way of nonlimiting example and with reference to the drawings, in which:

FIG. 1 is a schematic illustration of a transmitter in vertical cross section;

FIG. 2 is a schematic illustration of a top view of a modulator and a phase-tuning device of the transmitter of FIG. 1;

FIG. 3 is a flowchart of a process for fabricating the transmitter of FIG. 1;

FIGS. 4 to 15 are schematic illustrations, in vertical cross section, of various states of fabrication obtained during the implementation of the process of FIG. 3;

FIGS. 16 to 19 are schematic illustrations in vertical cross section of other possible embodiments of the transmitter of FIG. 1;

FIG. 20 is a partial flowchart of a process for fabricating the transmitter of FIG. 19;

FIGS. 21 to 24 are schematic illustrations, in vertical cross section, of various states of fabrication obtained during the implementation of the process of FIG. 20;

FIG. 25 is a schematic illustration of a process for fabricating the transmitter of FIG. 18; and FIGS. 26 to 31 are schematic illustrations, in vertical cross section, of various states of fabrication obtained during the implementation of the process of FIG. 25.

In these figures, the same references are used to designate the same elements. In the rest of this description, features and functions that are well known to those skilled in the art are not described in detail.

FIG. 1 shows a transmitter 5 of an optical signal that is phase and/or amplitude modulated in order to transmit data bits to a receiver by way of an optical fibre for example. For this purpose, the transmitter 5 includes a laser source 7 that emits an optical signal the phase and/or amplitude of which is then modulated by a system 6 for modulating the phase and/or amplitude of this optical signal.

For example, the wavelength $A_L$, of the optical signal emitted by the laser source 7 is comprised between 1250 nm and 1590 nm.

The system 6 may be a system for modulating phase alone, or amplitude alone or phase and amplitude simultaneously.

Typically, the laser source 7 may be a distributed Bragg reflector laser (DBR) or a distributed feedback laser (DFB). Such a laser source is well known and only those details that are necessary to make the invention understood are described here. For example, for general details and the details on the operating mode of such a laser source, the reader may refer to the following articles:

B. Ben Bakir et al., "Hybrid Si/III-V lasers with adiabatic coupling", 2011.

B. Ben Bakir, C. Sciancalepore, A. Descos, H. Duprez, D. Bordel, L. Sanchez, C. Jany, K. Hassan, P. Brianceau, V. Carron and S. Menezo, "*Heterogeneously Integrated III-V on Silicon Lasers*" Invited Talk ECS 2014.

To simplify FIG. 1 and the following figures, only one hybrid laser waveguide 200, 220 and one surface grating coupler 8 of the laser source 7 are shown.

Such a coupler 8 is for example described in the following article: F. Van Laere, G. Roelkens, J. Schrauwen, D. Taillaert, P. Dumon, W. Bogaerts, D. Van Thourhout and R. Baets, "*Compact grating couplers between optical fibres and Silicon-on-Insulator photonic wire waveguides with 69% coupling efficiency*". It is produced in a layer 3 including single-crystal silicon encapsulated in a dielectric material 116. Generally, a dielectric material has an electrical conductivity at 20° C. lower than $10^{-7}$ S/m and, preferably, lower than $10^{-9}$ S/m or $10^{-15}$ S/m. In addition, in the case of the dielectric material 116, its refractive index is strictly lower than the refractive index of silicon. For example, in this embodiment, the dielectric material 116 is silicon dioxide ($SiO_2$).

The layer 3 extends mainly horizontally and directly on a rigid substrate 44. In the layer 3, the single-crystal silicon is located in a given horizontal plane parallel to the plane of the substrate 44. Here, the single-crystal silicon of the layer 3 is also mechanically and electrically insulated from the substrate 44 by the dielectric material 116.

In FIG. 1 and the following figures, the horizontal is represented by the X and Y directions of an orthogonal coordinate system. The Z direction of this orthogonal coordinate system represents the vertical direction. Below, terms such as "upper", "lower", "above", "below", "top" and "bottom" are defined with respect to this Z direction. The terms "left" and "right" are defined with respect to the X direction. The terms "front" and "back" are defined with respect to the Y direction.

FIG. 1 shows the elements of the transmitter 5 in cross section in a vertical plane parallel to the X and Z directions.

For example, the maximum thickness of single-crystal silicon in the layer 3 is comprised between 100 nm and 800 nm. In this example, the maximum thickness of the single-crystal silicon in the layer 3 is equal to 300 nm or 500 nm.

The substrate 44 extends horizontally. In this exemplary embodiment, the substrate 44 is formed from a successive stack of a carrier 441 and of a layer 442 made of dielectric material. The thickness of the carrier 441 is typically larger than 200 μm or 400 μm. For example, the carrier 441 is a carrier made of silicon. The layer 442 is made of silicon dioxide. The thickness of the layer 442 is typically larger than 500 nm or 1 μm or more.

The hybrid laser waveguide 200, 220 consists of a waveguide 200 produced in III-V gain material and of a waveguide 220 made of single-crystal silicon. Generally, the waveguide 200 is used to generate and amplify an optical signal inside an optical cavity of the laser source 7. Here, for this purpose, it is produced in a layer 36 including a III-V gain material encapsulated in a dielectric material 117. For example, the material 117 is silicon dioxide or silicon nitride. This layer 36 extends horizontally and directly on a layer 20 made of dielectric material. The layer 20 itself extends horizontally directly on the layer 3, on the side of this layer 3 opposite the substrate 44.

The thickness of the layer 20 is typically comprised between 0.5 nm and 20 nm and, preferably, between 5 nm and 20 nm or between 1 nm and 10 nm. Here, the thickness of the layer 20 is equal to 6 nm.

The layer 36 typically comprises a doped lower sublayer 30, a stack 34 of quantum wells or quantum dots made of a quaternary material and an upper sublayer 32 doped with a dopant of opposite type to that of the sublayer 30. The sublayers 30 and 32 are for example here made of p- or n-doped InP. In this case, the stack 34 is, for example, a stack made up of an alternation of sublayers made of InGaAsP or of GaInNAs, etc.

In FIG. 1, only one strip 33, one stack 233 and one strip 234 have been shown, produced, respectively, in the sublayer 30, the stack 34 and the sublayer 32. This superposition of the strip 33, of the stack 233 and of the strip 234 constitutes the waveguide 200.

The waveguide 200 also includes:
contacts 243G and 243D making mechanical and electrical contact directly with the strip 33 and located, respectively, to the left and to the right of the stack 233, and
a contact 244 making mechanical and electrical contact directly with the strip 234.

These contacts 243G, 243D and 244 allow an electrical current to be injected into the waveguide 200 made of III-V gain material between the contacts 243G, 243D and the contact 244.

The waveguide 220 is made of silicon and produced in the single-crystal silicon of the layer 3. This waveguide 220 extends under the strip 33. In FIG. 1, the waveguide 220 has been shown, by way of illustration, in the particular case where the direction of propagation of the optical signal inside this waveguide is parallel to the Y direction. For example, for this purpose, the waveguide 220 has what is called a strip configuration. Thus, the transverse cross section of this waveguide, parallel to the XZ plane, contains a central protrusion 222 from which extend, on each side, parallelly to the X direction, thinner lateral arms 223G and 223D. Here, the waveguide 220 is separated from the strip 33 only by a segment of the layer 20. For example, the waveguide 220 is optically connected to the waveguide 200 by evanescent or adiabatic coupling. For a detailed description of one way of achieving adiabatic coupling, the reader may refer to the following article: Amnon Yariv et al., "Supermode Si/III-V hybrid Lasers, optical amplifiers and modulators: proposal and analysis" Optics Express 9147, Vol. 14, No. 15, 23 Jul. 2007.

The characteristics of the optical coupling between the waveguide 220 and the waveguide 200 in particular depend on the dimensions of the waveguide 220 and, in particular, on the thickness of the central protrusion 222. It is therefore important for the thickness of this protrusion 222 to be adjustable independently of the dimensions of the other photonic components produced on the same substrate 44. For example, here, the thickness of the protrusion 222 is equal to the maximum thickness of the single-crystal silicon in the layer 3, i.e. in this example to 300 nm or 500 nm.

To modulate the phase or the amplitude of the optical signal, the system 6 includes at least one modulator of the propagation loss and of the propagation index of a guided optical signal and, often, at least one phase-tuning device. For example, the system 6 is a Mach-Zehnder interferometer in which the modulator and the phase-tuning device are arranged in one of the branches of this interferometer in order to modulate the amplitude and/or phase of the optical signal generated by the laser source 7. The structure of a Mach-Zehnder interferometer is well known and is not described in detail here. Therefore, to simplify FIG. 1, only one modulator 100 and one phase-tuning device 300 have been shown in vertical cross section parallelly to the XZ plane.

The device 300 allows the phase of an optical signal propagating parallelly to the Y direction inside a waveguide 320 to be adjusted. For example, the waveguide 320 is longer in the Y direction than wide in the X direction. The waveguide 320 is made of silicon and produced in the single-crystal silicon of the layer 3. Here, its thickness is for example equal to the thickness of the protrusion 222. The refractive index of silicon varies greatly as a function of temperature. Thus, by varying the temperature of the waveguide 320, it is possible to modify the propagation speed of the optical signal in this waveguide and therefore to adjust the phase of the optical signal. For this purpose, the device 300 includes 2 heaters 322G and 322D each placed on one respective side of the waveguide 320. Here, the heater 322D is deduced from the heater 322G by orthogonal symmetry with respect to a vertical plane parallel to the Y and Z directions and passing through the middle of the waveguide 320. Thus, only the heater 322G will now be described in more detail with reference to FIGS. 1 and 2.

The heater 322G includes an arm 324 that extends, parallelly to the X direction, from a proximal end 56 to a distal end 58. The arm 324 also extends parallelly to the Y direction. The arm 324 is made from silicon. Here, it is produced in the single-crystal silicon of the layer 3.

The proximal end 56 makes direct mechanical contact with the waveguide 320. For example, here, the proximal end 56 touches a vertical flank of the waveguide 320. For this purpose, the arm 324 and the waveguide 320 form only one single block of material.

Here, the thickness of the proximal end 56 is smaller than the maximum thickness of the waveguide 320 so as to confine the optical signal in the waveguide 320. For example, the thickness of the proximal end 56 is 1.5 times or two times or three times or four times smaller than the maximum thickness of the waveguide 320.

The distal end 58 is doped to make the single-crystal silicon resistive and to form an electrical resistor that forms only a single block of material with the waveguide 320. In FIG. 1, the doped regions of the single-crystal silicon are finely hatched and appear dark. In this embodiment, the proximal end 56 is also doped in the same way as the distal end 58 so that all of the arm 324 is here made from doped single-crystal silicon. The shortest distance between this doped region of the arm 324 and the waveguide 320 is, for example, strictly larger than 200 nm or 400 nm.

To make an electrical current flow through the interior of the distal end 58, the heater 322G also includes two contacts 51G and 52G making mechanical and electrical contact directly with the distal end 58. Here, these contacts 51G and 52G are located one behind the other in the Y direction and at each end of the distal end 58 in this Y direction. The contacts of the heater 322D, which may be seen in FIG. 2, have been given the references 51D and 52D, respectively.

When a current, distributed via the contacts 51G and 52G, passes through the distal end 58, the latter converts some of the electrical energy thus received into heat that propagates, by thermal conduction, through the proximal end 56 to the waveguide 320. Thus, the heater 322G allows the waveguide 320 to be heated without the need to implant a or indeed any resistive elements in the waveguide 320 or in immediate proximity to this waveguide. Thus, the losses of power of the optical signal are limited with respect to the case where the electrical resistor is obtained by doping the waveguide 320 directly. The device 300 therefore allows the phase of the optical signal in the waveguide 320 to be slowly adjusted. In contrast, it does not allow the phase of the optical signal to be varied rapidly.

Conversely, the modulator 100 allows the phase of the optical signal to be rapidly modified. For this purpose, it includes 2 electrodes 120 and 130. These electrodes 120 and 130 may also be seen in the top view in FIG. 2.

The electrode 120 is made of doped single-crystal silicon. It is produced in the single-crystal silicon of the layer 3. It extends, in the X direction, from a proximal end 12 to a distal end 11. It also extends in the Y direction.

Here, the distal end 11 is more highly doped than the proximal end 12. For example, the dopant concentration in the distal end 11 is comprised between $10^{18}$ and $2 \times 10^{19}$ atoms/cm$^3$. The dopant concentration in the proximal end 12 is for example comprised between $10^{17}$ and $2 \times 10^{18}$ atoms/cm$^3$.

The electrode 130 is made from III-V crystalline material doped with a dopant of opposite type to that of the electrode 120. Here, it is made from InP in the sublayer 30. The dopant concentration of the electrode 130 is for example comprised between $10^{17}$ and $2 \times 10^{18}$ atoms/cm$^3$ or between $10^{17}$ and $2 \times 10^{19}$ atoms/cm$^3$.

The electrode 130 extends, parallelly to the X direction, from a proximal end 32 to a distal end 31. The electrode 130 also extends in the Y direction. It is located directly on the layer 20.

The proximal end 32 is located facing the proximal end 12 and separated from this proximal end 12 only by that segment of the layer 20 which is interposed between these proximal ends. With respect to a vertical plane parallel to the Y and Z directions and passing through the proximal ends 12 and 32, the distal end 31 is located on one side of this plane whereas the distal end 11 is located on the other side. The distal ends 11 and 31 are therefore not facing.

In the embodiment in FIG. 1 and the following figures, the zone 34, which extends vertically from the distal end 31 to the substrate 44, includes only solid dielectric materials. Here, it is a question of the dielectric materials 116 and of the layer 20. By virtue of this, the parasitic capacitance between this end 31 and the substrate 44 is greatly decreased. More precisely, the zone 34 is bounded horizontally:
  at the top, by a horizontal plane located at the level of the interface between the electrodes 130 and the layer 20, and
  at the bottom, by a horizontal plane located at the level of the interface between the layer 3 and the substrate 44.

The zone 34 is bounded vertically by a virtual vertical edge that runs all the way therearound. This vertical edge is shaped so that the orthogonal projection of the zone 34 in a horizontal plane is indistinguishable from the orthogonal projection of the distal end 31 in the same horizontal plane. The orthogonal projection of the distal end 31 in this horizontal plane corresponds to the orthogonal projection of the electrode 130 in this horizontal plane after subtraction of the orthogonal projection of the proximal end 32 in the same plane. The orthogonal projection of the proximal end 32 in this plane is equal to the intersection of the orthogonal projections of the electrodes 130 and 120 in this horizontal plane. In the particular case where the horizontal cross sections of the electrodes 130 and 120 are rectangular, as shown in FIG. 2, the zone 34 is therefore bounded vertically:
  to the left, by a vertical plane parallel to the Y and Z directions and that passes through a vertical flank of the distal end 31 parallel to the Y and Z directions,
  to the right, by a vertical plane parallel to the Y and Z directions and that passes through a vertical flank of the proximal end 12 parallel to the Y and Z directions,
  to the front, by a vertical plane parallel to the X and Z directions and that passes through a vertical front flank of the distal end 31 parallel to the X and Z directions, and
  to the back, by a vertical plane parallel to the X and Z directions and that passes through a vertical back flank of the distal end 31 parallel to the X and Z directions.

In FIG. 1, the zone 34 has been highlighted by filling it with circles. However, here, there is no discontinuity between the dielectric materials located inside the zone 34 and those located outside this zone 34. It is for this reason that the vertical edge described above was qualified as being "virtual".

The superposition, in the Z direction, of the proximal end 12, of a segment of the layer 20 and of the proximal end 32 is dimensioned to form a waveguide 70 capable of guiding, in the Y direction, the optical signal generated by the laser source 7. The waveguides 70 and 320 are for example optically connected to each other by an adiabatic coupler.

The maximum thickness of the proximal ends 12 and 32 is chosen so that the point M at which the maximum intensity of the optical field of the optical signal that propagates in the waveguide 70 is located is as close as possible to the layer 20 and, preferably, located at the centre of that segment of this layer 20 which is interposed between the proximal electrodes 12 and 32. Specifically, it is at the level of the interfaces between the proximal ends 12, 32 and the layer 20 that the charge carrier density is maximum when a potential difference is present between these proximal ends. Thus, by placing the point M in this location, the effectiveness of the modulator 100 is improved. In this embodiment, the refractive indices of the proximal ends 12 and 32 are close to each other. Therefore, the maximum thicknesses of the proximal ends 12 and 32 are chosen to be substantially equal so that the point M is located inside the layer 20. For example, the maximum thickness $e_{12}$ of the proximal end 12 is comprised between $0.5e_{32}$ and $1.5e_{32}$, and, preferably, between $0.7e_{32}$ and $1.3e_{32}$, where $e_{32}$ is the maximum thickness of the proximal end 32. For example, here the thicknesses $e_{12}$ and $e_{32}$ are each chosen equal to 300 nm.

The modulator 100 also includes 2 contacts 21 and 22, making mechanical and electrical contact directly with, respectively, the distal ends 11 and 30. These contacts 21 and 22 are connected to a voltage source that is commandable depending on the data bit or bits to be transmitted by the transmitter 5.

The following is one possible way of operating the transmitter 5. The laser source 7 generates an optical signal. At least one portion of this optical signal is directed toward a Mach-Zehnder interferometer at least one of the branches of which includes in succession the modulator 100 and the phase-tuning device 300. This portion of the optical signal is therefore guided in succession by the waveguide 70 then the waveguide 320 before being recombined with another portion of the optical signal guided by the other branch of the Mach-Zehnder interferometer in order to form the modulated optical signal. For example, the waveguides 70 and 320 are optically coupled to each other by an adiabatic coupler.

A process for fabricating the transmitter 100 will now be described with reference to FIGS. 3 to 15. FIGS. 4 to 15 show various states of fabrication of the transmitter 5 in vertical cross section parallelly to the X and Z directions.

In a step 500, the process starts with the provision of a substrate 4. Here, this substrate 4 is a silicon-on-insulator (SOI) substrate. The substrate 4 includes stacked directly on top of one another in the Z direction:
- a carrier 1 made of silicon, of thickness larger than 400 µm or 700 µm conventionally,
- a buried layer 2 made of silicon dioxide, and
- a layer 43 made of single-crystal silicon that, at this stage, has not yet been etched nor encapsulated in a dielectric material.

The thickness of the layer 2 is, for example, larger than 35 nm or 50 nm, or even larger than 500 nm or 1 µm. The thickness of the layer 2 is generally smaller than 10 µm or 20 µm. Preferably, for the implementation of the process of FIG. 3, the thickness of the layer 2 is smaller than 100 nm or 70 nm.

In a step 502, localized doping of the layer 43 is carried out. Here, a first localized doping operation 504 in which doped regions 506 (FIG. 5) of given dopant type are produced in the layer 43 is carried out first. These regions 506 are only produced in the locations of the future arms of the tuning device 300 and of the electrode 120 of the modulator 100. These regions 506 have a doping density equal to that of the distal end 58 and of the proximal end 12.

Next, a second doping operation 508 in which the layer 43 is doped is carried out so as to obtain a region 510 (FIG. 6) that is more highly doped than the regions 506. The region 510 is here partially superposed with one of the regions 506. For example, the region 510 is obtained by applying a new implantation to one portion of one of the regions 506. The region 510 is produced in the location of the future distal end 11 of the electrode 120. The doping of the region 510 is here equal to the doping of the distal end 11.

In a step 514, the layer 43 is subjected to a partial localized first etch (FIG. 7) in order to thin the thickness of the silicon in the locations of the electrode 120 and of the arms 324 of the heaters 322G and 322D. At the end of this step 514, the regions 506 and 510 are thinned and have a thickness smaller than the initial thickness of the layer 43. Here, the thickness of the thinned regions 506 and 510 is equal to the thickness of the electrode 120 and of the arms 324.

In this step 514, the thickness of the layer 43 is also thinned in non-doped regions, for example, in order to form the patterns of the future surface coupler 8 and the lateral arms 223G and 223D of the waveguide 220. In contrast, in this step 514, other what are called "non-thinned" regions are not etched and preserve their initial thickness. In particular, these non-thinned regions are located in the location of the protrusion 222 of the waveguide 220 and in the location of the waveguide 320.

In a step 516, a complete localized etch of the layer 43 is carried out (FIG. 8). Contrary to the partial edge, the complete etch completely removes the thickness of silicon of the layer 43 in the unmasked regions to which it is applied. Conversely, masked regions protect the layer 43 from this complete etch. This complete etch is carried out so as to structure, simultaneously in the layer 43, the waveguides 220 and 320, the arms of the tuning device 300, the surface coupler 8 and the electrode 120. For this purpose, only the regions corresponding to these various elements are masked. At the end of this step, the state shown in FIG. 8 is obtained.

In a step 518, the layer 43 of single-crystal silicon, which has been structured in preceding steps, is encapsulated in silicon dioxide (FIG. 9). The layer 3 including single-crystal silicon encapsulated in the dielectric material 116 is then obtained. The upper face of the material 116 is then prepared for bonding, for example direct bonding. For example, the upper face of the material 116 is polished using a process such as a chemical-mechanical polishing (CMP) process.

In a step 520, the upper face of the substrate 4, i.e. at this stage the polished face of the material 116, is then bonded to the exterior face of the substrate 44 (FIG. 10), for example, by direct bonding. The substrate 44 has already been described with reference to FIG. 1.

In a step 522, the carrier 1 is removed, and the layer 2 is partially thinned in order to leave only a thin layer of silicon dioxide on the layer 3. Thus, here, the layer 20 is produced by removing only one portion of the layer 2 made of dielectric material so as to leave behind a thin layer of this dielectric material, which covers the layer 3 and thus forms the layer 20 (FIG. 11). Thus, at the end of this step, a stack is obtained containing the substrate 44 and the layers 3 and 20.

In a step 524, a layer 36A (FIG. 12) made of III-V gain material is produced on the layer 20. For example, the layer 36A is bonded to the layer 20 above the waveguide 220 and the electrode 120. The layer 36A includes the sublayer 30 made of InP doped with a dopant of opposite type to that of the electrode 120, the stack 34 and the sublayer 32.

In a step 526, a complete localized etch (FIG. 13) of the sublayer 32 and of the stack 34 is carried out in order to structure the strip 234 in the sublayer 32 and the stack 233 in the stack 34. In this step, the sublayer 30 is not etched.

In a step 528, a complete localized etch (FIG. 14) of the sublayer 30 is carried out to simultaneously structure the strip 33 and the electrode 130 in this sublayer.

In a step 530, the structured layer 36A is encapsulated (FIG. 15) in the dielectric material 117. The layer 36 including the III-V gain material encapsulated in the dielectric material 117 is then obtained.

Lastly, in a step 532, contacts 21, 22, 51G, 52G, 51D, 52D, 243G and 243D are produced. The transmitter 5 such as shown in FIG. 1 is then obtained.

This fabricating process has many advantages. In particular:
- It allows the thickness of the layer 20 to be precisely controlled and a particularly planar layer 20 to be obtained because it is produced on the side of the layer 3, which has the same level everywhere, thereby simplifying the bonding of the layer 36A.
- It allows the thickness of the electrode 120 to be precisely adjusted independently of the thickness of the waveguide 220 and, more generally, independently of the thickness of the layer 43 made of single-crystal silicon. This is particularly useful because, generally, to improve the operation of the laser source 7, it is necessary for the thickness of the waveguide 220 to be quite large, i.e. here about 500 nm, and for the thickness of the strip 33 to be quite small, i.e. here about 300 nm or 150 nm. In contrast, to improve the operation of the modulator 100, as explained above, the thickness of the electrode 120 and, in particular of its proximal end 12, must be chosen depending on the thickness of the proximal end 32. Here, the thickness of the proximal end 32 is set by the thickness of the sublayer 30 made of crystalline InP. It is therefore 300 nm or 150 nm.

This process does not complexify the fabrication of the transmitter 5. For example, it allows, in one and the same etching operation, the strip 33 of the waveguide 200 and the electrode 130 of the modulator 100 to be produced. Likewise, the electrode 120 and the waveguide 220 are fabricated simultaneously in the same etching operation.

This process makes it possible to avoid forming a parasitic capacitance under the distal end 31 and therefore allows the modulator 100 to operate more rapidly.

FIG. 16 shows a transmitter 550 that is identical to the transmitter 5 except that the substrate 44 has been replaced by a substrate 552. The substrate 552 is identical to the substrate 44 except that the layer 442 has been omitted. The process for fabricating the transmitter 550 is, for example, the same as that described for the transmitter 5 except that in step 520, it is the substrate 552 that is used instead of the substrate 44.

FIG. 17 shows a transmitter 560 that is identical to the transmitter 5 except that the modulator 100 has been replaced by a modulator 562. The modulator 562 is identical to the modulator 100 except that the electrode 120 has been replaced by an electrode 564. The electrode 564 is identical to the electrode 120 except that the distal end 11 has been replaced by a distal end 566. The distal end 566 is identical to the distal end 11 except that its maximum thickness is here larger than the thickness of the proximal end 12. Here, the thickness of the distal end 566 is equal to the maximum thickness of the waveguide 220 and therefore of the layer 43 made of single-crystal silicon.

FIG. 18 shows a transmitter 570 that is identical to the transmitter 550 except that the modulator 100 has been replaced by a modulator 572. The modulator 572 is identical to the modulator 100 except that the electrode 120 has been replaced by an electrode 574.

The electrode 574 is identical to the electrode 120 except that the proximal end 12 and the distal end 11 are mechanically and electrically connected to each other by an intermediate portion 576 the thickness $e_{576}$ of which is strictly smaller than the maximum thickness of the proximal end 12. The intermediate portion 576 is separated from the layer 20 by a recess 578 filled with a dielectric material. Here, the recess 578 is filled with the material 116. The bottom of this recess is essentially horizontal and spaced apart from the layer 20 by a depth $p_{578}$. The depth $p_{578}$ is typically larger than 50 nm or 100 nm. Here, the depth $p_{578}$ is equal to 150 nm. This configuration of the electrode 574 makes it possible to better control the width of the waveguide 70. Specifically, in this embodiment, the width of the waveguide 70 is set only by the width W of the proximal end 12 in the X direction. Specifically, the segments of the electrode 130 that extend beyond, in the X direction, the proximal end 12 are insulated from the electrode 574 by the recess 578. This width W is, by etching, defined to within +/−δ, where δ is an error typically equal to +/−5 nm or +/−10 nm. This configuration of the electrode 574 therefore makes it possible to be less sensitive to errors in the position of the electrode 130. Specifically, the electrode 130 is positioned by lithographic alignment, with a precision δal typically equal to +/−30 nm or +/−100 nm. In the absence of the recess 578, the width W of the waveguide 70 is defined by the width of the overlap of the electrodes 130 and 120 and therefore with an error of +/−δal. Moreover, the embodiment of FIG. 18 allows the capacitance of the modulator to be better controlled. For example, it has been calculated that the error in the capacitance of the modulator 572 is about 1.6% whereas in the absence of the recess 578, this error would be close to 25%.

The thickness $e_{576}$ is chosen so as to prevent or limit the propagation of the optical signal in the distal end 11. Here, this thickness $e_{576}$ is also smaller than the thickness of the proximal end 12. For example, the thickness $e_{576}$ is smaller than or equal to $0.5 \times e_{12}$, where $e_{12}$ is the maximum thickness of the proximal end 12. Here, the thickness $e_{576}$ is equal to 150 nm and the thickness $e_{12}$ is equal to 300 nm. For example, the portion 576 is produced as described with reference to the process of FIG. 25.

FIG. 19 shows a transmitter 600 that is identical to the transmitter 5 except that:
the waveguide 220 has been replaced by a waveguide 610,
the surface coupler 8 has been replaced by a surface coupler 608,
the arms of the tuning device have been replaced by arms 612G and 612D, and
the electrode 120 has been replaced by an electrode 614.
The electrode 614 includes:
a proximal end 618 facing the proximal end 32 of the electrode 130,
a distal end 616 that is directly mechanically and electrically connected to the contact 21, and
an intermediate portion 620 that mechanically and electrically connects the ends 616 and 618.

Contrary to the preceding embodiment, the thickness of the proximal end 618 is here equal to the maximum thickness of the waveguide 610. This thickness is therefore here equal to the maximum thickness of the layer 43 made of single-crystal silicon. This embodiment still has the advantage of having under the distal end 31 of the electrode 130, the zone 34 that consists only of solid dielectric material. Thus, the modulator of the transmitter 600 only has a negligible parasitic capacitance in this location and its operation is therefore more rapid than the modulator described in patent application US2015/0055910.

In this embodiment, the thickness of the distal end 616 is equal to the thickness of the proximal end 618. The thickness of the intermediate portion 620 is in contrast strictly smaller and, preferably two times smaller, than the thickness of the proximal end 618 in order to prevent the propagation of the optical signal in the distal end 616. As in the embodiment in FIG. 18, the intermediate portion 620 is separated from the layer 20 by a recess 622 filled with the material 116. The intermediate portion 620 and the recess 622 are shaped as described for the intermediate portion 576 and for the recess 578 so as to preserve the advantages of the embodiment of FIG. 18.

A process for fabricating the transmitter 600 will now be described with reference to FIGS. 20 to 24.

The process starts with steps 650 and 652 that are identical to the steps 500 and 502, respectively. The state presented in FIG. 21, which is identical to the state shown in FIG. 6 except that the doped regions 506 and 510 are not located in exactly the same locations, is then obtained.

In a step 654, the layer 43 is subjected to a partial localized etch (FIG. 22) such as that described with reference to step 514 in order to thin the single-crystal silicon in the location of the future intermediate portion 620. This partial localized etch is also used to thin, at the same time, the single-crystal silicon in the locations of the future arms 612G and 612D, of the lateral arms of the waveguide 610 and of the surface coupler 608.

In a step 656, the layer 43 is subjected to a complete localized etch (FIG. 23) in order to simultaneously structure, in the single-crystal silicon, the electrode 614, the surface coupler 608, the arms 612G and 612D and the waveguide 610. This step is for example carried out as described for the step 516.

In a step 658 (FIG. 24), the single-crystal silicon is encapsulated in silicon dioxide. Thus, the layer 3 of single-crystal silicon encapsulated in the dielectric material 116 is obtained. The upper face of the material 116 is then prepared for direct bonding. This step is similar to the step 518 described above.

Next, the fabrication of the transmitter 600 continues with steps 524 to 532 of the process of FIG. 3. To simplify FIG. 20, these following steps have not been shown.

FIG. 25 shows a process for fabricating the transmitter 570. This process is identical to that of FIG. 3 except that it includes additional steps 702 to 714 between the steps 522 and 524 of the process of FIG. 3. To simplify FIG. 25, the steps before step 522 and after step 524 have not been shown.

In step 702 (FIG. 26), a layer 720 of silicon nitride is deposited directly on the layer 20.

In step 704 (FIG. 27), the layer 720 is completely removed only facing the location in which the recess 578 must be etched in the electrode 120. The layer 720 thus forms, from this stage, an etching mask.

In step 706 (FIG. 28), the electrode 120 is partially etched through the etching mask formed by the layer 720 in order to produce the recess 578 and the intermediate portion 576 of the electrode 120.

In step 708 (FIG. 29), a layer 722 made of dielectric material such as silicon oxide, is deposited directly on the upper face of the layer 720. This layer 722 then completely fills the recess 578.

In step 710 (FIG. 30), the upper face is planarized, i.e. polished, using the layer 720 as a stop layer. For example, this polish is a physical-chemical polish (chemical mechanical planarization). At the end of this step, the upper face of the layer 720 is uncovered and directly exposed to the exterior. The recess 578 for its part remains filled with the dielectric material.

In step 712 (FIG. 31), the layer 720 is completely removed in order to uncover the upper face of the layer 20.

In step 714, the uncovered face of the layer 20 is polished and prepared for the bonding of the layer 36A in step 524.

Many other embodiments are possible. For example, the modulator 100 may also be a ring modulator. For this purpose, the waveguide 70 is looped back on itself to form a ring waveguide in which the charge carrier density may be modified depending on the potential difference applied between the contacts 21 and 22. Typically, this ring waveguide is coupled by evanescent coupling to a waveguide in which the optical signal to be modulated propagates. In this case, the phase-tuning device 300 may be omitted. The waveguide 70 may thus constitute only a limited segment of the ring waveguide.

In another embodiment, the modulator is used to modulate the intensity of the optical signal that passes therethrough. Specifically, a modification of the charge carrier density in the waveguide 70 also modifies the intensity of the optical signal that passes therethrough.

As a variant, only the proximal end 12 is thinned and the distal end 11 is not. Thus, in this embodiment, for example, the thickness of the end 11 is equal to the thickness of the layer 43 made of single-crystal silicon. Specifically, to centre the point M, at which the maximum of the intensity of the optical field of the optical signal is located, on the centre of the layer 20, it is the thickness of the ends 12 and 32 that is important. The thickness of the distal ends 11 and 31 has no notable importance regarding this point.

As one variant, the doping of the proximal end 12 and of the distal end 11 are the same. Thus, during the fabrication of the electrode 120, one of the 2 steps of doping the layer 43 made of single-crystal silicon may be omitted.

Other dielectric materials are possible for the material 116 and the layer 20. For example, it may be a question of silicon nitride, of aluminium nitride, of an electrically insulating polymer, of $Al_2O_3$. In addition, in the case of the layer 20, its refractive index is not necessarily lower than that of silicon.

In another variant, the layer 20 is completely removed in the locations where it is not essential to the operation of the transmitter. For example, it is completely removed except between the proximal ends 12 and 32 and between the waveguide 220 and the strip 33. In another variant, the layer 20 is also removed between the waveguide 220 and the strip 33.

Other III-V gain materials are possible for producing the layer 36. For example, the layer 36 is formed from bottom to top from the following stack:
 a lower sublayer made of n-doped GaAs,
 sublayers containing quantum dots made of AlGaAs, or AlGaAs quantum wells, and
 an upper sublayer made of p-doped GaAs.

The III-V material used to produce the sublayer 30 may be different. For example, it may be a question of n- or p-doped GaAs. It will also be noted that the optical losses in p-doped InP are higher than in n-doped InP, and that it is therefore preferable to use in the modulator for the electrode 130 n-doped InP.

In another embodiment, the electrode 130 is produced from a III-V material that is different from that used to produce the strip 33. In this case, the electrode 130 and the strip 33 are not structured in the same sublayer made of III-V material.

Whatever the embodiment, it is possible to invert the p- and n-doped regions.

As a variant, some or all of the contacts are produced, not through the material 117, but through the substrate 4, 44 or 552. In this case, with respect to what was shown in the preceding figures, one or more electrical contacts emerge under the substrate.

As a variant, the waveguides 70, 220, 320, 610 are curved. In this case, the configuration of the various elements optically coupled to these waveguides is adapted to the radius of curvature of these waveguides.

The waveguide 220 may have what is called an "strip" configuration, i.e. the lateral arms 223G and 223D are omitted or any other configuration capable of guiding an optical signal.

As a variant, the heater 322D is omitted. In another variant, the thickness of the distal end 58 is strictly larger than the thickness of the proximal end 56. For example, the thickness of the distal end 58 is equal to the maximum thickness of the waveguide 320.

The doping of the proximal end 56 may be different from that of the distal end 58. For example, the doping of the proximal end 56 may be equal to that of the distal end 11 or different. In another variant, the proximal end 56 is not doped.

Other fabricating processes are possible. For example, the insulating layer 20 may be obtained by different fabricating processes. For example, the step 522 is replaced by a step in which the layer 2 is completely removed to the layer 3 then the layer 20 is deposited on the uncovered layer 3. In this case, optionally, the layer 20 may be produced in a dielectric material that is different from the material 116, such as an electrically insulating polymer or $Al_2O_3$. After the layer 2 has been completely removed, it is also possible to produce the layer 20 by oxidation of the surface of the layer 3 or by oxidation of the sublayer 30 made of III-V material before its direct bonding to the layer 3.

As another variant, the complete localized second etch is replaced by a uniform etch of all the surface of the layer 3 in order to convert the non-thinned regions into thinned regions and to completely remove the thinned regions.

The various embodiments of the phase-tuning device described above may be implemented independently of the various embodiments of the modulator. In particular, the phase-tuning device may be used in any photonic system in which it is necessary to tune the phase of an optical signal that propagates in a waveguide made of silicon and irrespectively of whether this system includes a modulator such as that claimed here. For example, the tuning device may also be implemented in any photonics system using a modulator such as that described in patent application US2015/0055910. It may also be used in a photonics system including no modulator.

The presence of the intermediate portion 576 or 620 may be implemented independently of the presence of a laser source and/or a tuning device on the same substrate. It may also be applied whatever the materials used to fabricate the electrodes of the modulator. Such an intermediate portion may equally well be produced in both electrodes as in a single one of these electrodes. The electrode in which the intermediate portion is produced may equally well be the electrode located under the layer 20 as on the layer 20. The thickness of the intermediate portion must be smaller than the thickness of the proximal end. In contrast, its thickness is not necessarily as small as the thickness of the distal end. For example, its thickness may be equal to the thickness of the distal end. For example, an intermediate portion, such as the portion 576 or 620, may advantageously be introduced in the embodiments of a modulator described in patent applications US2009103850, WO2011/037686, US2015/0055910 and U.S. Pat. No. 6,845,198B2 among others.

The invention claimed is:

1. A photonic transmitter comprising:
  a stack including a substrate mainly extending in a plane called the "plane of the substrate" and a layer, including single-crystal silicon, extending directly over said substrate and mainly parallelly to the plane of the substrate,
  a semiconductor laser source able to generate an optical signal, said laser source including a first waveguide made of III-V material etched in a layer made of III-V gain material, said layer made of III-V gain material including a sublayer made of doped III-V crystalline material,
  a modulator of the propagation losses and of the propagation index of a guided optical signal produced in the same substrate and able to modulate the optical signal generated by the semiconductor laser source, said modulator including:
    a first electrode made of p- or n-doped single-crystal silicon structured in the single-crystal silicon of the layer including single-crystal silicon,
    a second electrode made of doped III-V crystalline material having a doping of opposite type to that of the first electrode,
  wherein:
    the layer including single-crystal silicon is a layer including single-crystal silicon encapsulated in a dielectric material,
    the stack includes a layer made of dielectric material extending directly over the layer including single-crystal silicon,
    the sublayer made of doped III-V crystalline material extends directly over the layer made of dielectric material,
    the first electrode of the modulator extends, in a transverse direction parallel to the plane of the substrate, from a proximal end to a distal end, and extending longitudinally in the direction of propagation of the optical signal,
    the second electrode of the modulator extending, in the transverse direction, from a proximal end located facing the proximal end of the first electrode to a distal end located on a side that is opposite the distal end of the first electrode with respect to an axis perpendicular to the plane of the substrate and passing through the proximal ends, said second electrode also extending longitudinally in the direction of propagation of the optical signal,
    the layer made of dielectric material is interposed between the proximal ends of the first and second electrodes of the modulator in order to electrically insulate them from each other, and
    the modulator also includes:
      a first waveguide able to guide the optical signal to be modulated in the direction of propagation of the optical signal, said first waveguide being formed by the proximal ends of the electrodes and that segment of the layer made of dielectric material which is interposed between these proximal ends,
      contacts making direct mechanical and electrical contact with, respectively, the distal ends of the electrodes, for electrically connecting the first and second electrodes to different electric potentials so as to modify the charge carrier density inside the first waveguide,
      a zone composed only of one or more solid dielectric materials, which extends:
        in the direction perpendicular to the plane of the substrate, from the distal end of the second electrode to the substrate, and
        in the transverse direction and in the direction of propagation of the optical signal, under the entirety of the distal end of the second electrode.

2. The transmitter according to claim 1, wherein the second electrode of said modulator is etched in the sublayer made of doped III-V crystalline material extending directly over the layer made of dielectric material.

3. The transmitter according to claim 1, wherein:
  the semiconductor laser source includes a second waveguide produced in the single-crystal silicon of the layer including single-crystal silicon and located under the first waveguide made of III-V material, said second waveguide being optically connected to the first waveguide made of 111-V material by adiabatic or evanescent coupling, and
  the maximum thickness of the proximal end of the first electrode is different from the maximum thickness of the second waveguide.

4. The transmitter according to claim 3, wherein the maximum thickness of the proximal end of the first electrode is strictly smaller than the maximum thickness of the second waveguide.

5. The transmitter according to claim 4, wherein the maximum thickness of the proximal end of the first electrode is comprised between $0.7e_{32}$ and $1.3e_{32}$, where $e_{32}$ is the maximum thickness of the proximal end of the second electrode.

6. The transmitter according to claim 1, wherein the proximal end and the distal end are mechanically and electrically connected to one another by an intermediate portion the thickness of which is strictly smaller than the maximum thickness of the proximal end.

7. The transmitter according to claim 6, wherein the intermediate portion is separated from the layer made of dielectric material by a recess filled with a dielectric material.

8. The transmitter according to claim 1, wherein the second electrode is made from InP or from GaAs.

9. The transmitter according to claim 1, wherein the transmitter also comprises:
  a third waveguide able to guide the optical signal generated by the laser source and produced in the single-crystal silicon of the layer including single-crystal silicon,
  a device for tuning the phase of the optical signal that propagates in said third waveguide, said tuning device including:
  an arm produced in the single-crystal silicon of the layer including single-crystal silicon and that extends, in a transverse direction parallel to the plane of the substrate and perpendicular to the direction of propagation of the optical signal in the third waveguide, from a proximal end making direct mechanical contact with the third waveguide, to an n- or p-doped distal end, the minimum thickness of the proximal end of said arm in a direction perpendicular to the plane of the substrate being strictly smaller than the maximum thickness of the third waveguide in the same direction, said arm also extending in the direction of propagation of the optical signal in the third waveguide,
  contacts making direct mechanical and electrical contact with the distal end, for making a current able to heat the waveguide by thermal conduction through the arm flow through said distal end.

10. A process for fabricating a semiconductor photonic transmitter, said process comprises:
  providing a first stack including in succession a first carrier, a buried layer made of dielectric material and a layer made of single-crystal silicon, then
  locally doping the layer made of single-crystal silicon so as to obtain a first region of the layer made of single-crystal silicon that is doped,
  carrying out a partial localized first etch of the thickness of the layer made of single-crystal silicon so as to thin the thickness of the layer made of single-crystal silicon at least in the first doped region and to thus obtain a first thinned doped region, while leaving the thickness of the layer made of single-crystal silicon unchanged in other regions that are said to be "non-thinned",
  carrying out a second complete localized etch of the layer made of single-crystal silicon, which completely removes the thickness of the layer made of single-crystal silicon in the regions etched during said second etch and leaves the thickness of the layer made of single-crystal silicon unchanged in masked regions to which said second etch is not applied, the masked regions and the etched regions being arranged, during said second etch, with respect to one another, in order to simultaneously structure:
  the second waveguide made of single-crystal silicon in a non-thinned portion of the layer made of single-crystal silicon,
  the first electrode of the modulator, the proximal end of the first electrode being produced in the first thinned doped region, the proximal end of the first electrode then having a thickness strictly smaller than the thickness of the second waveguide, then
  encapsulating the layer made of structured single-crystal silicon in a dielectric material in order to obtain a layer of single-crystal silicon encapsulated in a dielectric material, then
  bonding a second substrate to the layer of encapsulated single-crystal silicon, then
  removing the first carrier and all or some of the buried layer and producing the layer made of dielectric material on the layer made of encapsulated single-crystal silicon on the side from which the first carrier was removed, then
  producing the layer made of III-V gain material directly on the layer made of dielectric material.

11. The process according to claim 10, wherein providing said first stack includes providing a first stack in which the thickness of the buried layer made of dielectric material is smaller than 100 nm or 70 nm.

12. The process according to claim 10, wherein the process includes a step of etching the sublayer made of doped III-V crystalline material in order to simultaneously produce the second electrode of the modulator and a strip of the waveguide made of 111-V material in said sublayer made of 111-V crystalline material.

13. The process according to claim 10, wherein:
  during the localized doping of the layer made of single-crystal silicon, a second region, adjacent to the first region, is doped less strongly than the first region, and
  during the second etch, the masked regions and etched regions are arranged, with respect to one another, in order to produce the distal end of the first electrode in the second doped region.

14. The process according to claim 10, wherein:
  the localized doping of the first layer made of single-crystal silicon is carried out so as to obtain, in addition to the first doped region, an additional doped region in the layer made of single-crystal silicon,
  the partial localized first etch is carried out so as to obtain, in addition to the first thinned doped region, at least one additional thinned region in the layer made of single-crystal silicon,
  during the complete localized second etch, the masked regions and etched regions are arranged to simultaneously structure, in addition to the second waveguide and the first electrode:
  a third waveguide made of single-crystal silicon in a non-thinned region of the layer made of single-crystal silicon, and
  an arm that extends, in a transverse direction parallel to the plane of the substrate and perpendicular to the direction of propagation of the optical signal in the third waveguide, from a proximal end making direct mechanical contact with the third waveguide, to a distal end, the distal end being produced in the additional doped region of the layer made of single-crystal silicon and the proximal end being produced in the additional thinned region of the layer made of single-crystal silicon so that the minimum thickness of the proximal end of said arm in a direction perpendicular to the plane of the substrate is strictly smaller than the maximum thickness of the third waveguide in the same direction, said arm also extending in the direction of propagation of the optical signal in the third waveguide, then producing contacts making direct mechanical and electrical contact with the distal end of the arm, in order to make a current flow through said distal end and thus heat the arm.

\* \* \* \* \*